(12) United States Patent
Bond

(10) Patent No.: US 6,417,528 B1
(45) Date of Patent: Jul. 9, 2002

(54) HIGH SPEED SEMICONDUCTOR PHOTODETECTOR

(75) Inventor: Aaron Eugene Bond, Allentown, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/493,758

(22) Filed: Jan. 28, 2000

(51) Int. Cl.[7] ............................................. H01L 31/0328
(52) U.S. Cl. ........................ 257/186; 257/199; 257/91; 257/184
(58) Field of Search ............................... 257/184, 199, 257/91, 186; 438/380; 327/584

(56) References Cited

U.S. PATENT DOCUMENTS

| | | | |
|---|---|---|---|
| 5,134,671 A | | 7/1992 | Koren et al. .................. 385/14 |
| 5,625,202 A | * | 4/1997 | Chai .............................. 257/94 |
| 5,703,379 A | * | 12/1997 | Le Person .................... 257/21 |
| 5,880,482 A | * | 3/1999 | Adesida ........................ 257/21 |
| 5,923,049 A | * | 7/1999 | Bohm ........................... 257/55 |
| 6,130,441 A | * | 10/2000 | Bowers ......................... 257/15 |

OTHER PUBLICATIONS

Traveling–Wave Photodetectors for High Power, Large-Bandwidth Applications, *IEEE Transactions On Microwave Theory And Techniques*, vol. 43, No. 9, Sep. 1995.

* cited by examiner

*Primary Examiner*—Olik Chaudhuri
*Assistant Examiner*—Nathan W. Ha

(57) ABSTRACT

The invention is a semiconductor avalanche photodetector including an essentially undoped multiplication layer; a thin, undoped light absorbing layer; and a doped waveguide layer which is separate from the light absorbing layer and is capable of coupling incident light into the light absorbing layer.

12 Claims, 2 Drawing Sheets

HIGH SPEED SEMICONDUCTOR PHOTODETECTOR

FIELD OF THE INVENTION

This invention relates to semiconductor photodetectors, and in particular to Avalanche Photodetectors.

BACKGROUND OF THE INVENTION

Optoelectronic devices are now receiving a great deal of attention for use in telecommunications networks primarily for their huge information handling capacity. An integral part of the network is the semiconductor photodetector which converts incident light to an electrical signal. A standard type of photodetector is the PIN diode which includes an intrinsic semiconductor light-absorbing layer sandwiched between n-type and p-type semiconductor layers. One of the problems associated with such a device is that the relatively thick intrinsic layer (usually 200–400 nm) limits the transit time of electrons and holes generated by the incident light and therefore limits the speed of the device. Recently, it has been proposed to reduce the intrinsic layer thickness and sandwich it between two waveguide layers in order to increase the absorption length. Such a device still suffers from transit time limitations, since the intrinsic region, which is defined as the region including an electric field when a bias is supplied to the device, includes the thickness of the waveguide layers. It has also been suggested that light could be coupled to the intrinsic region of a standard PIN device by means of a waveguide.

Another type of photodetector is the waveguide avalanche photodetector. This type of device usually includes, as part of the intrinsic layer, an undoped absorbing and waveguide layer, a doped charge layer, and an undoped multiplication layer. Again, such devices have a fairly thick intrinsic layer, usually of the order of 700 to 1000 nm, which limits transit times.

It is desirable, therefore, to provide a photodetector which exhibits fast transit times so that the device can be operated at high speeds.

SUMMARY OF THE INVENTION

The invention in one aspect is a semiconductor avalanche photodetector which includes an essentially undoped multiplication layer, a thin, substantially undoped light absorbing layer, and a doped waveguide layer which is separate from the light absorbing layer and is capable of coupling incident light into the light absorbing layer. In other aspects the invention is a method of fabricating an avalanche photodetector and a network and receiver including an avalanche photodetector.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
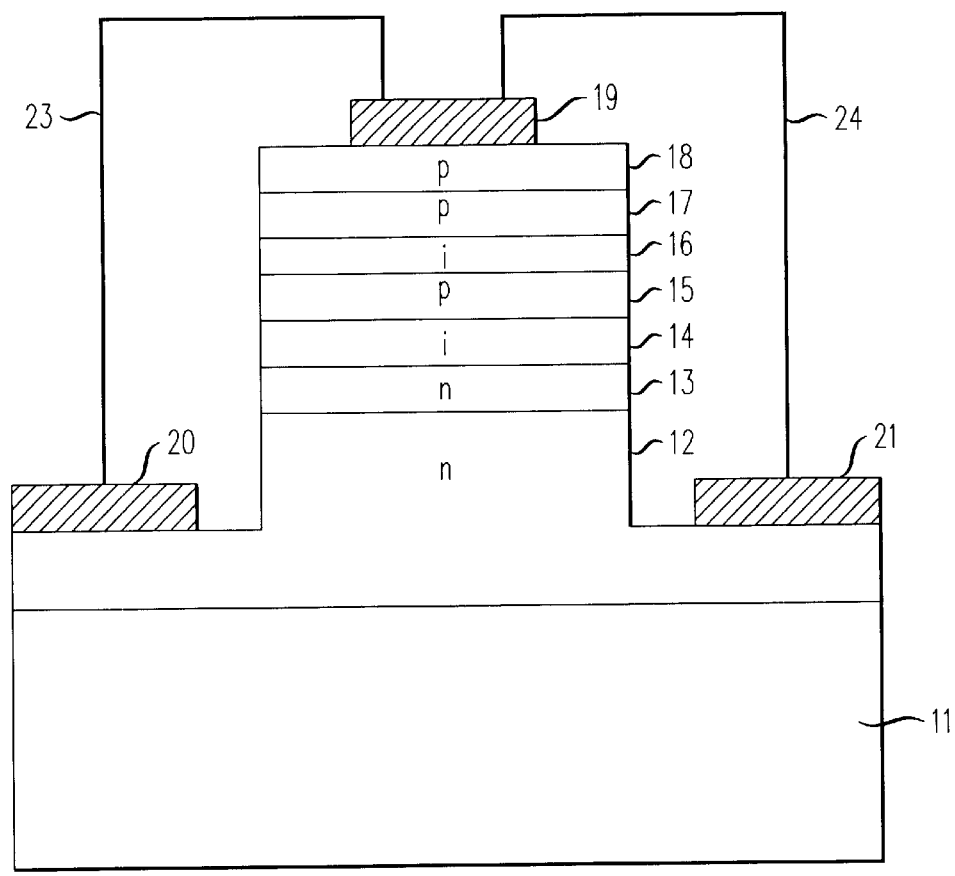
FIG. 1 is a cross sectional view of an avalanche photodetector in accordance with an embodiment of the invention.
Figure 2:
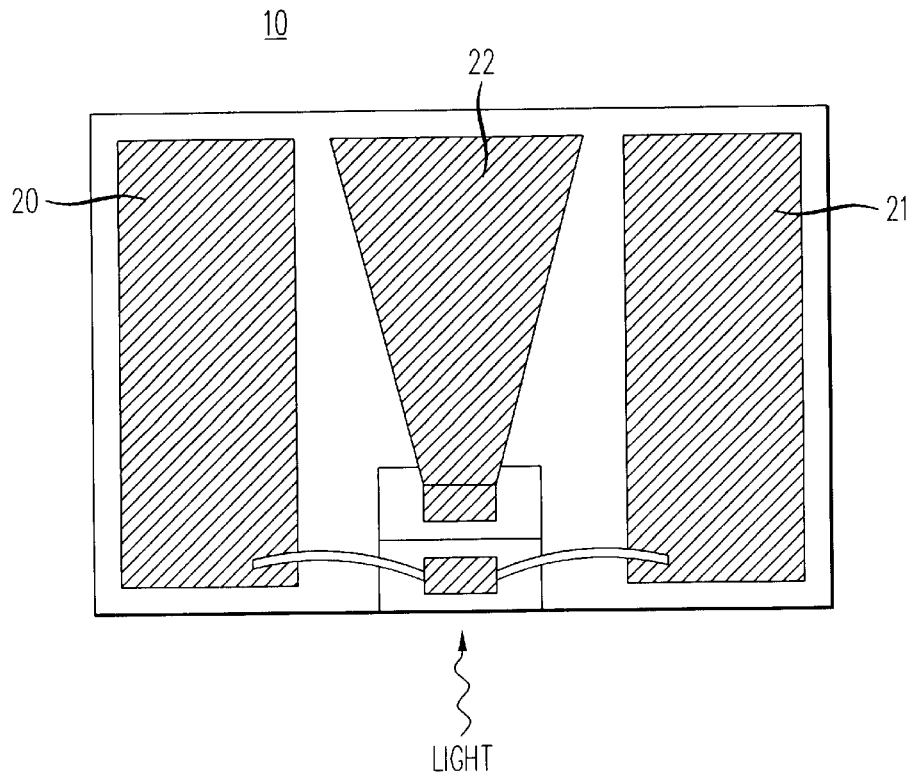
FIG. 2 is a top view of the device of FIG. 1.

A typical device made in accordance with the invention is illustrated in FIGS. 1 and 2. It will be appreciated that in the cross sectional view of FIG. 1, light (represented by the arrow in FIG. 2) would be incident on an edge of the device from the viewer into the page of the figure. The invention in accordance with this embodiment is a semiconductor avalanche photodetector, 10, which includes an essentially undoped multiplication layer, 14, a thin, substantially undoped light absorbing layer, 16, and a doped waveguide layer, 17, which is separate from the light absorbing layer and is capable of coupling incident light usually into the light absorbing layer.

In more detail, the device, 10, is usually formed on a semiconductor substrate, 11, which, in this case, is preferably semi-insulating InP. Formed on the substrate by standard techniques, such as Metal Organic Chemical Vapor Deposition (MOCVD), or other well known techniques, are a succession of epitaxial semiconductor layers, 12–18. The first layer is a cladding layer, 12, which is preferably n-type InP material which typically has a thickness of 400–1000 nm and is doped to an exemplary concentration of about $2\times10^{18}$ $cm^{-3}$. Formed on the cladding layer, 12, is an n-doped charge layer, 13, which in this example is InAlAs. This layer is typically 200 nm thick and is doped to an exemplary concentration of $2\times10^{18}$ $cm^{-3}$ so as to substantially prevent tunneling of charge carriers into the cladding layer and substrate. It will be appreciate that, although use of the charge layer, 13, and cladding layer, 12, are preferable, they are not essential to the invention.

Formed on the charge layer, 13, is a multiplication layer, 14, which is substantially undoped (intrinsic). It should be appreciated that "undoped" in the context of the application means not intentionally doped, and the layer could include some small amount of background doping (less than $1\times10^{17}$ $cm^{-3}$) of n or p-type dopants. In this example, the layer, 14, comprises InAlAs, but could be any semiconductor material which provides multiplication of free carriers generated in the device in response to incident light, such as InP. The thickness of the layer, 14 is typically in the range 200 to 1000 nm. A second charge layer, 15, is preferably formed on the multiplication layer, 14. This layer is preferably doped with p-conductivity type impurities to a concentration within the range $7\times10^{17}$ to $2\times10^{18}$ $cm^{-3}$. In this example, the layer, 15, comprises InAlAs with a preferred thickness in the range 50–100 nm and serves to shield the absorber layer, to be described, from the high electric fields generated in the multiplication layer during the operation of the device. Other suitable materials include InP.

A thin, substantially undoped absorbing layer, 16, is formed on the charge layer, 15. In this example, the layer, 16, comprises InGaAs, but could be any semiconductor material which absorbs incident light and generates free carriers in response thereto. The thickness of this layer is desirably in the range 50–100 nm.

Formed on the absorbing layer, 16, is a transparent waveguide, 17. The waveguide layer is preferably doped with p-conductivity type impurities to a concentration within the range $7\times10^{17}$ to $1\times10^{18}$ $cm^{-3}$. In this example the waveguide layer preferably comprises InGaAsP but could be any other material which has a higher index of refraction than, and is lattice matched to, the cladding layer, 18, to be described. The thickness of the waveguide layer is preferably 200–400 nm.

Finally, a p-type doped cladding layer, 18, is formed over the waveguide layer, 17. The layer, 18, in this example comprises InP, but could be any material that has a lower index of refraction than the waveguide layer. The thickness of the cladding layer, 18, is typically within the range 1000–2000 nm. Electrical contact to the cladding layer, 18, is provided by metal layer 19 on the cladding layer, and metal layers 20 and 21 on the n-cladding layer, 12. Contact ribbons, 23 and 24, electrically connect metal layer, 19, to metal layers 20 and 21. As illustrated in FIG. 2, electrical contact to n-type cladding layer, 13, is provided by metal layer, 22, formed on an etched step of the device exposing the cladding layer, 13. The metal layers, 19–22 could be gold alloys or any other conductive material which forms an ohmic contact to the semiconductor material. It will be appreciated that this contacting scheme is only one of many possible techniques which could be employed to contact the device.

In operation, and as understood, a reverse bias is supplied to the device through contacts, 20–22 while light propagates through the waveguide layer, 17, in the direction into the page of FIG. 1. The light couples to the absorber layer, 16, as it moves along the waveguide layer, 17, resulting in the generation of free carriers (electrons and holes) in the absorbing layer. These carriers are swept out of the absorbing layer, 16, by the applied electric field, and the electrons multiply by impact ionization in the multiplication layer, 14. This increase in electrons is detectable by circuitry (not shown) connected to the contacts, 20–22. It is understood that other additional or alternative mechanisms may occur as well.

Figure 3:
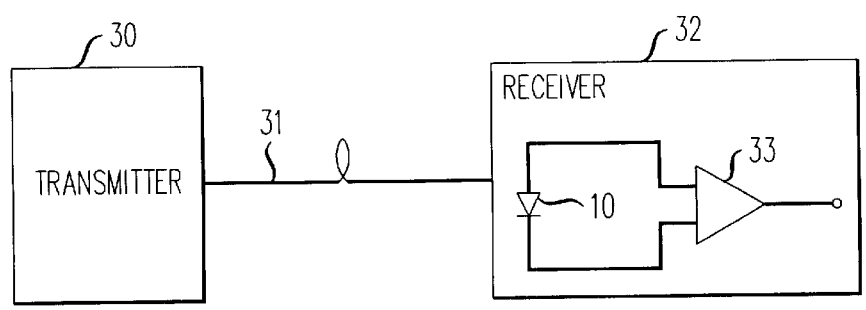
FIG. 3 is a schematic drawing of a portion of a network including the device of FIGS. 1 and 2.

FIG. 3 illustrates a portion of a typical optical network which may employ the device, 10, previously described. A transmitter, 30, which preferably includes a semiconductor laser (not shown) transmits light of one or more wavelengths over an optical fiber 31. The fiber, 31, couples the light to an optical receiver, 32, which includes the avalanche photodetector, 10. Current generated by the photodetector, 10, in response to the light is preferably electrically coupled to a transimpedance amplifier, 33, which amplifies the electrical signal and converts the current to a voltage signal which is coupled as the data signal to the rest of the receiver and other portions of the network.

It will be appreciated that some of the advantages of the present invention may reside in the separation of the waveguide layer, 17 from the absorber layer, 16. That is, since the waveguide layer is now a separate, doped layer, there is no substantial electric field across the layer and it is no longer part of the intrinsic region of the device. Instead, the intrinsic region comprises layers 14–16. This means that the intrinsic layer thickness can be reduced to a typical value of 300–500 nm. This, in turn, reduces the transit time of the carriers resulting in faster devices. For example, in a typical prior art APD, the absorption and waveguide layer is at least 350 nm for efficient waveguiding, the charge layer is about 50 nm, and the multiplication layer is about 200 nm, giving an intrinsic region thickness of approx. 600 nm. The transit time limited bandwidth, which is inversely proportional to the thickness of the intrinsic region, in such a device would be approximately 38 GHz. In an example of the present invention, the thickness of the absorbing layer, 16, is reduced to 50 nm, and the intrinsic layer thickness (layers 14–16) is reduced to 300 nm. This gives a transit time limited bandwidth of approx. 76.6 GHz. Desirably, the transit time limited bandwidth is at least 40 GHz. In addition, the power handling of such a device is increased by a factor of 25 due to the distributed absorption of light over the first 50 microns of the absorber layer as opposed to absorption of the light in the first few microns of the thicker waveguide absorber layer in the prior art example above. Finally, the separation of the waveguide and absorption layers permits tailoring absorption properties independent of waveguide design considerations.

What is claimed is:

1. A semiconductor avalanche photodetector comprising: an essentially undoped multiplication layer; a thin, substantially undoped light absorbing layer; and a doped waveguide layer which is separate from the light absorbing layer and is capable of coupling incident light into the light absorbing layer.

2. The device according to claim 1 further comprising a first charge layer disposed adjacent to one surface of the multiplication layer, and a second charge layer disposed adjacent to an opposite surface of the multiplication layer.

3. The device according to claim 1 wherein the absorbing layer has a thickness within the range 50–100 nm.

4. The device according to claim 1 wherein the device has an intrinsic region including the absorbing and multiplication layers, and the thickness of the intrinsic region is within the range 300 to 500 nm.

5. The device according to claim 4 wherein the intrinsic region also includes a charge layer.

6. The device according to claim 1 wherein the absorbing layer comprises InGaAs.

7. The device according to claim 6 wherein the waveguide layer comprises InGaAsP.

8. The device according to claim 7 wherein the multiplication layer comprises InAlAs.

9. The device according to claim 1 wherein the device has a transit time limited bandwidth of at least 40 GHz.

10. The device according to claim 1 wherein the waveguide layer is doped to a concentration within the range $7 \times 10^{17}$ to $1 \times 10^{18}$ cm$^{-3}$.

11. An optical receiver including an avalanche photodetector comprising:

an essentially undoped multiplication layer; a thin, substantially undoped light absorbing layer; and a doped waveguide layer which is separate from the light absorbing layer and is capable of coupling incident light into the light absorbing layer.

12. An optical network including a transmitter, an optical fiber optically coupled to the transmitter, and an optical receiver optically coupled to the optical fiber, the receiver including an avalanche photodetector comprising:

an essentially undoped multiplication layer; a thin, substantially undoped light absorbing layer; and a doped waveguide layer which is separate from the light absorbing layer and is capable of coupling incident light into the light absorbing layer.

* * * * *